United States Patent [19]

Borel et al.

[11] 4,035,665
[45] July 12, 1977

[54] CHARGE-COUPLED DEVICE COMPRISING SEMICONDUCTORS HAVING DIFFERENT FORBIDDEN BAND WIDTHS

[75] Inventors: Joseph Borel, Echirolles; Jacques Lacour, Grenoble; Gerard Merckel, Sassenage, all of France

[73] Assignee: Commissariat a l'Energie Atomique, Paris, France

[21] Appl. No.: 703,545

[22] Filed: July 8, 1976

Related U.S. Application Data

[63] Continuation-in-part of Ser. No. 541,615, Jan. 16, 1975, abandoned.

[30] Foreign Application Priority Data

Jan. 24, 1974 France .......................... 74.02410

[51] Int. Cl.² .............. G11C 19/28; H01L 29/78; H01L 29/161
[52] U.S. Cl. .............. 307/221 D; 357/16; 357/24; 357/61; 357/63; 357/91
[58] Field of Search .................. 357/16, 24, 63, 91, 357/61; 307/221 D, 304

[56] References Cited

U.S. PATENT DOCUMENTS

| | | | |
|---|---|---|---|
| 3,209,215 | 9/1965 | Esaki | 357/16 |
| 3,234,057 | 2/1966 | Anderson | 357/16 |
| 3,275,906 | 9/1966 | Matsukura et al. | 357/34 |
| 3,338,760 | 8/1967 | Brownson | 357/16 |
| 3,725,145 | 4/1973 | Maki | 357/63 |
| 3,740,620 | 6/1973 | Agusta et al. | 357/16 |
| 3,783,351 | 1/1974 | Tsuskada et al. | 357/16 |
| 3,789,267 | 1/1974 | Krambeck et al. | 357/24 |
| 3,796,932 | 3/1974 | Amelio et al. | 357/24 |
| 3,819,959 | 6/1974 | Chang et al. | 357/24 |

FOREIGN PATENT DOCUMENTS

| | | | |
|---|---|---|---|
| 224,977 | 11/1958 | Australia | 357/16 |
| 940,931 | 11/1963 | United Kingdom | 357/16 |

OTHER PUBLICATIONS

Donnelly et al., "The Photovoltaic Response of nGe–nSi Heterodiodes" Solid–State Electronics vol. 9, (1966), pp. 174–178.

*Primary Examiner*—William D. Larkins
*Assistant Examiner*—Gene M. Munson
*Attorney, Agent, or Firm*—Cameron, Kerkam, Sutton, Stowell & Stowell

[57] ABSTRACT

Asymmetrical potential wells are created in surface zones of a first doped semiconductor forming a substrate and are of greater depth at the downstream end than at the upstream end in order to ensure unidirectional transfer of the minority carriers. Regions localized at one extremity of the surface zones and constituting the potential wells are formed by a second semiconductor having a forbidden band width which is different from that of the first semiconductor.

12 Claims, 4 Drawing Figures

CHARGE-COUPLED DEVICE COMPRISING SEMICONDUCTORS HAVING DIFFERENT FORBIDDEN BAND WIDTHS

REFERENCE TO RELATED APPLICATION

This application is a continuation-in-part application of our application Ser. No. 541,615, filed Jan. 16, 1975, now abandoned.

This invention relates to charge-coupled devices in which the substrate is formed of two semiconductors having different forbidden band widths and has potential applications in the field of electronics, especially in the construction of shift registers, delay lines, memory systems, retinas and so forth.

Charge-coupled devices (CCD) are semiconductor systems in which charges are stored in potential wells created at the surface of a semiconductor and in which these charges are transferred by displacing the potential wells. In very broad outline, these devices comprise a doped semiconductor substrate, a layer of insulating material and an array of metallic electrodes which are brought to suitable potentials. This structure is therefore of the metal-insulator-semiconductor type in which the insulator can consist in particular of an oxide. The charges displaced by this method in devices of this type are minority carriers of the semiconductor substrate, for example the holes if the semiconductor is $n$-type.

For background information on the general properties of these charge-coupled devices, reference can be made to the two original articles published on this subject in the "Bell System Technical Journal," volume 49, 1970 and entitled respectively "Charge-coupled semiconductor devices" by W. S. Boyle and G. E. Smith (page 587) and "Experimental verification of the charge-coupled device concept" by G. F. Amelio, M. F. Tompsett and J. E. Smith (page 593).

In these devices, it is necessary to ensure unidirectionality of charge transfer and it is accordingly necessary to create for the minority carriers asymmetrical potential wells which are of greater depth at the downstream end than at the upstream end. There are many known means for creating wells of this type. For example, it is possible to make use of three clocks each connected to one electrode out of three by means of three control lines which cross each other; in order to reduce the number of clocks and associated control lines to two, it is possible to form within the semiconductor and beneath an electrode a surface region which is more heavily doped beneath the upstream edge of the electrode than beneath the remainder of the electrode. The thickness of oxide between the electrode and the semiconductor substrate can also be varied.

The present invention proposes a novel means for obtaining unidirectionality of charge transfer in devices of this type. In very general terms, the means just mentioned consist in placing two different semiconductors in the zone in which it is desired to create an asymmetrical well, the widths of the forbidden bands of the two semiconductors being different. As will become apparent hereinafter, this design solution offers many advantages, especially insofar as it results in very simple methods of fabrication and produces an improvement in the performances of the charge-coupled devices to which it is applied.

More specifically, the invention is directed to a charge-coupled device comprising a substrate constituted by a first doped semiconductor, an array of metallic electrodes disposed in succession along an axis and isolated from said substrate by means of a thin insulating layer, means for creating in surface zones of the substrate asymmetrical potential wells of greater depths in the downstream direction than in the upstream direction for the minority charge carriers and thus for ensuring unidirectionality of transfer of said carriers along said axis, means for injecting minority carriers beneath at least the first electrode, means for detecting the presence of charges beneath at least the last electrode, a voltage source for bringing the electrodes to cyclically varying potentials of suitable value. Said means for creating asymmetrical potential wells in surface zones of the substrate and ensuring unidirectionality of transfer of said carriers are constituted by regions located within said substrate at one extremity of said zones and formed by a second semiconductor having a forbidden band width which is different from that of the first semiconductor, one of the two semiconductors which has the smaller forbidden band width being located downstream of said zone.

The characteristic features and advantages of the invention will be more clearly brought out by the following description of examples of construction which are given by way of explanation and not in any sense by way of limitation, reference being made to the accompanying drawings, wherein.

In the following description, consideration will be given solely by way of explanation to the example of $n$-type semiconductors in which the minority carriers (which are the transferred charges in the device described) are holes.

Figure 1:
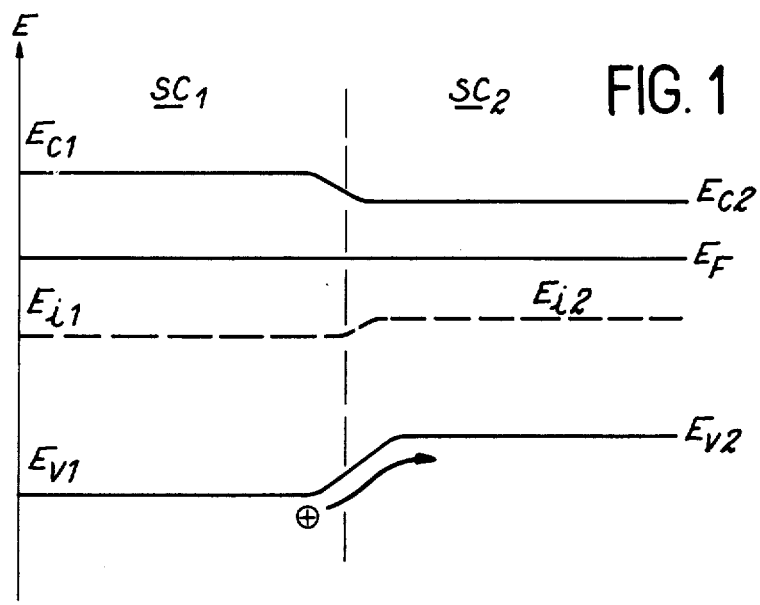
FIG. 1 is a schematic diagram showing the distribution of energies of the different bands of two semiconductors which are employed conjointly in accordance with the invention in order to ensure unidirectionality of charge transfer.

The schematic diagram of FIG. 1 shows the distribution of energies of the different bands of two semiconductors having two forbidden bands of different width. The left-hand portion corresponds to a semiconductor $SC_1$ having a conduction band whose energy is denoted by $E_{c1}$ and a valence band whose energy is denoted by $E_{v1}$. Similarly, the right-hand portion corresponds to a semiconductor $SC_2$ having a conduction band whose energy is denoted by $E_{c2}$ and a valence band whose energy is denoted by $E_{v2}$. At the junction of these two semiconductors, the Fermi levels whose energies are denoted by $E_F$ are in coincidence when equilibrium is attained. The intrinsic energies $E_i$ are by definition the mean energies between the energies of the conduction band and of the valence band.

From conventional considerations in semiconductor theory, it follows that the position of the Fermi level with respect to the valence band is defined by the following relation:

$$E_f - E_v = E_g - kT \log \frac{N_c}{N_D}$$

where $E_g$ is equal to the width of the forbidden band, namely $E_c - E_v$, where $k$ is the Boltzman constant, $T$ is the absolute temperature, $N_c$ is a constant which depends only on the temperature and the mass of the charge carriers and where $N_D$ is the density of the negative carriers.

Should it be desired to ensure that the energy of the valence band of the semiconductor 2 is greater than the energy of the valence band of the semiconductor 1, the following condition must be satisfied:

$$E_{g1} - kT \log \frac{N_{c1}}{N_{D1}} > E_{g2} - kT \log \frac{N_{c2}}{N_{D2}} \quad (1)$$

where $N_{D1}$ and $N_{D2}$ characterize the dopings of the semiconductors $SC_1$ and $SC_2$. The inequality (1) is equivalent to the inequality:

$$\frac{N_{c2} N_{D1}}{N_{c1} N_{D2}} > \exp - \left[ \frac{E_{g1} - E_{g2}}{kT} \right] \quad (2)$$

If the dopings $N_{D1}$ and $N_{D2}$ and the constants $N_{c1}$ and $N_{c2}$ are closely related, the inequality (2) is satisfied as soon as the energies of the forbidden bands $E_{g1}$ and $E_{g2}$ differ to a slight extent, which is the case in practice. Taking the case of the silicon and germanium pair as an example, $E_g$ has the values of 1.1 eV and 0.7 eV respectively, thus resulting in a difference of 0.4 eV between the values of the forbidden bands. In the case of a pair of semiconductors of this type, the exponential quantity of the relation (2) is very small and if the dopings and the constants $N_c$ do not differ from each other to any substantial degree, the inequality is satisfied.

The situation of the valence bands is in that case as shown in the diagram of FIG. 1. From this it follows that the holes of the semiconductor $SC_1$ and therefore the charges transferred in the charge-coupled device are constrained to move from the valence band of the semiconductor 1 towards the valence band of the semiconductor 2. There has thus been produced a field which acts on the minority carriers in a unidirectional manner, which is the primary object of the invention.

FIG. 1 relates to a general case but it can readily be understood that, if the dopings and the constants $N_c$ are closely related or in other words if $N_{D1} \neq N_{D2}$ and $N_{c1} \neq N_{c2}$, the energies $E_{c1}$ and $E_{c2}$ of the conduction bands will be very close in value. Similarly, by calculating the difference between the Fermi energy and the intrinsic energy, it can be established that the two intrinsic energies of the semiconductors $SC_1$ and $SC_2$ coincide in the particular case in which:

$$\frac{N_{c2} N_{D1}}{N_{c1} N_{D2}} = \exp \left[ - \frac{E_{g1} - E_{g2}}{2 kT} \right] \quad (3)$$

which can also be written;

$$\frac{N_{c2} N_{D1}}{N_{c1} N_{D2}} = \frac{n_{i1}}{n_{i2}} \quad (4)$$

where $n_i$ is the density of charges in the conduction band (or the number of holes in the valence band which is equal thereto) for the corresponding intrinsic semiconductor.

It is therefore clear from the foregoing that the condition governing the doping of the two semiconductors is not critical if there is a sufficient difference in energy between the two forbidden bands. In practice, it is an advantage to adopt the conditions in which the two dopings are very nearly the same, thus simplifying the fabrication.

Figure 2:
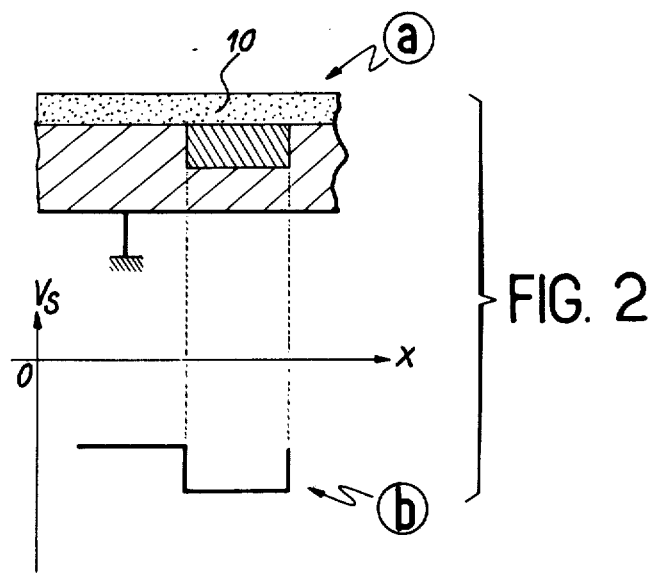
FIG. 2 is a sectional view of a zone of a charge-coupled device in which an asymmetrical surface potential well has been created by adding within a first semiconductor a region constituted by a second semiconductor having a forbidden band which differs from that of the first semiconductor (FIG. 2a) and shows the profile of the surface potential resulting from this addition (FIG. 2b)

In FIG. 2a, there is shown in cross-section a zone of a charge-coupled device in which an asymmetrical potential well has been created by adding to a first semiconductor $SC_1$ a region constituted by a second semiconductor $SC_2$ having a width of forbidden band which is different from that of the first semiconductor. It is assumed in the diagram of FIG. 2 that the semiconductor $SC_2$ is placed downstream with respect to the direction D of displacement of the minority carriers. In accordance with the diagram of FIG. 1, it is seen that the semiconductor $SC_2$ is the one in which the forbidden band has the smallest width; the semiconductor $SC_2$ will be germanium for example if $SC_1$ is silicon. The device comprises in addition to the two semiconductors $SC_1$ and $SC_2$ an insulating layer 10 having any desired shape and capable of supporting other devices which are not shown and are characteristic of charge-coupled devices.

FIG. 2b shows the profile of the surface potential $V_s$ along the zone represented in FIG. 2a. The potential just mentioned is that of the interface between the semiconductor and the insulator 10. Since the minority carriers are attracted into the semiconductor $SC_2$, the potential well is of greater depth at the level of said semiconductor $SC_2$ than in the remainder of the zone. This accordingly results in a stepped profile of the type shown in FIG. 2a. By adding to a semiconductor $SC_1$ a second semiconductor $SC_2$ having a forbidden band of smaller width, this accordingly constitutes an effective means for creating an asymmetrical surface potential well of greater depth in the downstream direction than in the upstream direction and is conducive to ensuring unidirectionality of charge transfer within a charge-coupled device.

Figure 3:
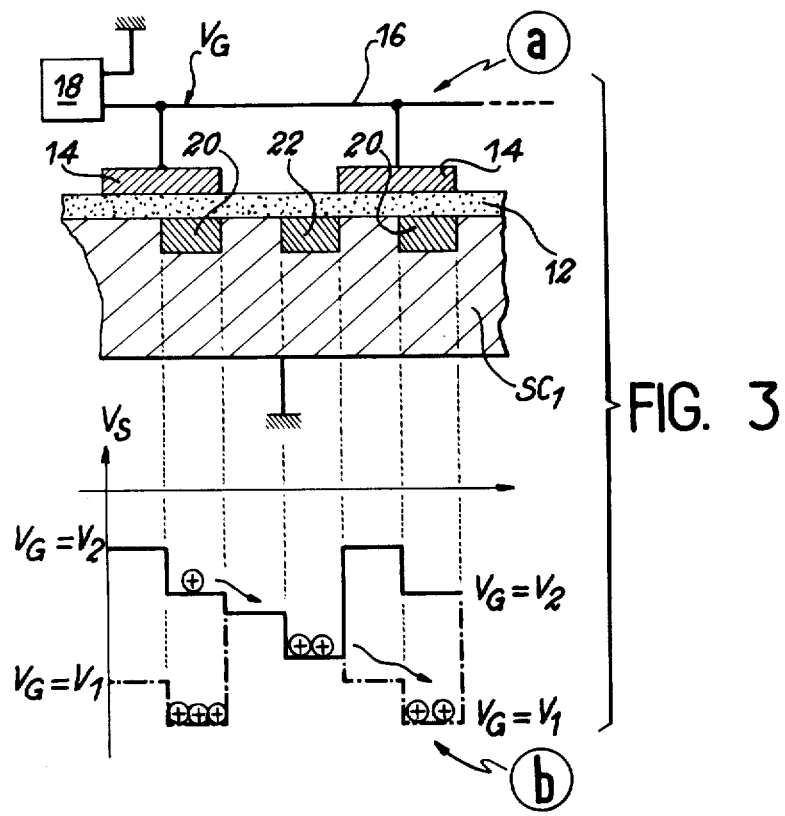
FIG. 3 illustrates the application of the means shown in FIG. 2 to a charge-coupled device having a single control line (3a) and the surface potential profile along said device (3b)
Figure 4:
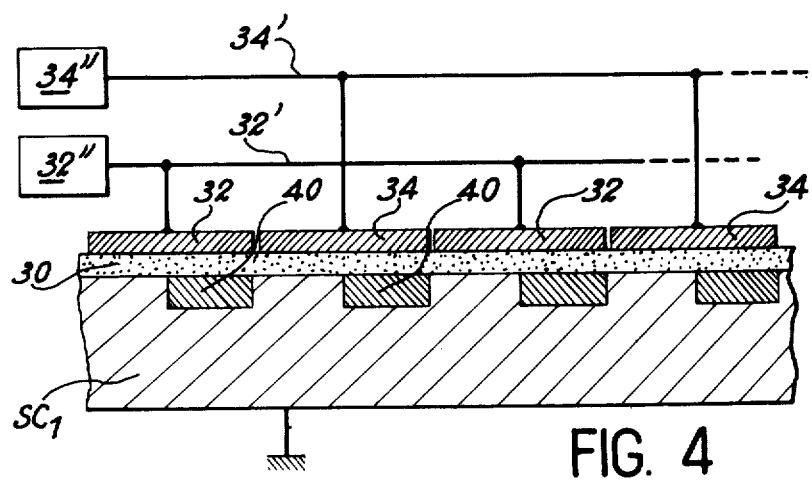
FIG. 4 illustrates the application of the means shown in FIG. 2 to a charge-coupled device having two control lines.

FIGS. 3 and 4 illustrate the application of the means aforesaid to charge-coupled devices.

There is shown in FIG. 3 a charge-coupled device having a single control line. In FIG. 3a which is a sectional representation of a device of this type, there is shown a first semiconductor $SC_1$ on which are placed an insulating layer 12 and electrodes 14 all connected to a lead 16 from a voltage supply 18 designed to deliver a voltage $V_G$ which varies cyclically between two limiting values $V_1$ and $V_2$. The device of FIG. 3a additionally comprises on the one hand, beneath the electrodes, a region 20 constituted by a second semiconductor $SC_2$ and on the other hand, within the interelectrode gap, an identical region 22 constituted by the same semiconductor $SC_2$.

The surface potential at the interface between the semiconductor $SC_1$ and the insulator 12 varies along the device in the manner which is shown in FIG. 3b. In the case of a predetermined value of the voltage $V_G$, there is observed beneath each electrode an asymmetrical potential well of greater depth in the downstream direction than in the upstream direction in accordance with the properties of the two-semiconductor zone located beneath the electrodes. The depth of said wells depends on the voltage $V_G$ applied to the electrodes 14. Two values of these potentials in respect of the two limiting values $V_1$ and $V_2$ of the voltage $V_G$ are represented in FIG. 3b. For the same reasons, an asymmetrical potential well of greater depth in the downstream direction than in the upstream direction is also observed within the interelectrode gap but this well is permanent since the surface potential within the interelectrode gap is largely independent of the potential applied to the electrodes and is established at the mean value between $V_1$ and $V_2$ at the end of a sufficient time interval when the surface resistances are suitably chosen. A fact worthy of mention is that it is also possible to employ a second set of electrodes interposed between the first electrodes and connected by means of a line similar to the lead 16 to a source of constant potential which is equal to the mean value aforesaid. The device is then immediately ready to operate but is more complex.

The operation of the charge-coupled device in accordance with the invention is as follows: when the voltage $V_G$ applied is equal to $V_1$ (as a rule, this voltage is negative in the case of an $n$-type substrate), the depth of the potential wells created beneath the electrodes is of maximum value and the positive charges are trapped therein within the downstream zone. When the voltage $V_G$ assumes the value $V_2$, the depth of the potential well beneath the electrodes 14 is reduced and the charges which may be trapped therein are transferred into the permanent asymmetrical potential well of the interelectrode gap which is directly adjacent and located downstream. These charges are transferred into the potential well created beneath the following electrode when the voltage $V_G$ reverts to the value $V_1$.

The voltage $V_G$ can have any waveform and may for example be rectangular. The only conditions to be satisfied are that the values of $V_1$ and $V_2$ are such that the minimum depth of the potential well downstream of the electrodes is smaller than the depth of the potential well upstream of the interelectrode gap and that the maximum depth of the potential well upstream of the electrodes must be greater than the depth of the potential well downstream of the interelectrode gap: under these conditions the transfer of charges can take place correctly during a voltage cycle first from the zone located beneath the electrodes towards the interelectrode gap, then from said interelectrode gap towards the zone located beneath the following electrode.

The technique of fabrication of the CCD of the present invention by ionic implantation consists in the choice of the two semiconductors utilized which is first dictated by the fact that the parameters of the mesh should be close for the two semiconductors. This condition is satisfied by the germanium-silicon couple which is later discussed in the present application. The energy of implantation can be about 200 keV and the dose is on the order of $10^{18}/cm^2$. These conditions produce a junction having a depth on the order of 2000 Å. The structure can be heated to 600° C to suppress defects and decrease the leakage current. The different energy levels of the silicon doped N to about $10^{15}/cm^3$ are disposed, with respect to the energy levels of the intrinsic germanium in such a way that the space between the valence bands is about 0.5 V. When the germanium is doped, this spacing increases and can reach 0.8 V for a P type germanium dopage on the order of $10^{18}$ to $10^{20}/cm^3$. Therefore, in accordance with the present invention, either a SiN-Ge couple can be used or the SiN-GeP couple of appropriate concentration, the action of the doping of the germanium permitting modification of the potential barrier providing in accordance with the present invention a unidirectionality of the transfer of charges.

The method of manufacture is classic and relates to the technology of producing transistors of the MOS type. On a substrate of type SiN, for example, successive operations are carried out of diffusion of type P, deposit of a thin layer of oxide, ionic implantation of germanium in certain zones followed by doping of the germanium, heating of the assembly, deposit of metallic contacts, deposit of a layer of aluminum and engraving to produce the electrodes.

The original means in accordance with the invention for producing unidirectionality of charge transfer does not apply solely to a charge-coupled device having a single control line but also and again by way of explanation to a charge-coupled device having two control lines of the type shown in FIG. 4. This device comprises a substrate constituted by a first semiconductor $SC_1$ and an insulating layer 30 on which are deposited electrodes 32 and 34 connected respectively to a lead 32' and 34', said leads being connected to two clocks 32" and 34". The means for producing unidirectionality of charge transfer is constituted by the addition of regions 40 placed beneath the downstream end of each electrode and constituted by a second semiconductor SC2 having a forbidden band width which is smaller than that of the semiconductor $SC_1$. Under these conditions, asymmetrical potential wells which are of greater depth in the downstream direction than in the upstream direction are created beneath each electrode and the device thus formed operates in the same manner as any charge-coupled device having two control lines. By way of example, reference can be made to U.S. Pat. No. 3,829,884, filed Jan. 13, 1972, or to the article by W. F. Kosonocky and G. E. Carmes published in the "IEEE Journal of Solid State Circuits," volume 6, No. 5, Oct. 1971 and entitled "Charge-Coupled Digital Circuit."

In the two charge-coupled devices hereinabove described and comprising either one or two control lines, it is always possible to carry out compensation on the entire semiconductor substrate and thus to adjust the voltage $V_S$ so as to ensure that the appropriate values of $V_1$ and $V_2$ are symmetrical with respect to ground. If the semiconductor is $n$-type as has been assumed by way of explanation, it will be possible with this object in view to apply a uniform $p$-type deposit on the semiconductor, for example by ion implantation of boron. In addition to the advantage of having symmetrical voltages with respect to ground, this alternative form of construction makes it possible to "bury" the channel in which the minority carriers travel, thereby eliminating recombinations at the surface of the semiconductor and improving the performances of the device.

A first advantage of the means in accordance with the invention lies in the fact that this latter leads to planar charge-coupled devices or in other words devices in which the potential profile is not stepped and in which the technology is highly simplified in comparison with equivalent devices of the prior art. A second advantage lies in the fact that charge-coupled devices having a single control line can be fabricated with great ease. In all cases, the solution proposed by the invention does not entail critical conditions in regard to doping. In particular, doping need not be light and this accordingly limits the influence of recombinations of the carriers.

In order to form the complex semiconductor substrate which is necessary for the application of the invention, it is clearly feasible to juxtapose crystals of small width of the two different semiconductors or to introduce into a large-sized crystal of a first type of semiconductor, a series of crystals of small width of the other type of semiconductor. Such forms of construction appear to be more theoretical than practical; the most convenient method of obtaining the desired result is to start from a large-sized crystal of a first type of semi-conductor and to produce local modifications in the forbidden band width of said semiconductor in a series of zones of small width by incorporation of atoms of the other type of semiconductor. The forbidden band width of the zones thus formed can thus be modified progressively up to the maximum width corresponding to that of the semiconductor of the second type.

Fabrication of the semiconductor substrate by the method just described can be carried out by means of the diffusion technique but is preferred much more readily by ion implantation.

The example of silicon and germanium given in the foregoing is not intended to imply any limitation and it is possible in particular to create within a silicon substrate zones constituted by a composite semiconductor of type III–V such as GaAs, GaP, GaSb, InAs, InP, InSb or of the type II–VI such as CdSe, CdTr, ZnSe, ZnTe, for example.

In the case just mentioned, it is only necessary to carry out two successive implantations of ions of the two components of the composite semiconductor.

Finally, the best performances of the device in accordance with the invention will be obtained by having recourse to the silicon-on-insulator technology.

What we claim is:

1. A charge-coupled device comprising a substrate constituted by a first doped semiconductor, an array of metallic electrodes disposed in succession along an axis and isolated from said substrate by means of a thin insulating layer, means for injecting minority carriers beneath at least the first electrode, which defines the upstream end of said device, means for detecting the presence of charges beneath at least the last electrode, which defines the downstream end of said device, a voltage source and at least one control line for bringing the electrodes to cyclically varying potentials of suitable value, means for creating asymmetrical potential wells in a plurality of surface zones of the substrate having a downstream end and an upstream end for ensuring unidirectionality of transfer of said carriers, said means being constituted by regions each localized within said substrate at one extremity of each said zones and formed by a second semiconductor having a forbidden band width which is different from that of the first semiconductor, one of the two semiconductors which has the smaller forbidden band width being located at said downstream end of each zone.

2. A charge-coupled device according to claim 1 having a first control line connected to one electrode out of two, and a second control line connected to the other electrode wherein each surface zone is localized beneath each electrode.

3. A charge-coupled device according to claim 2, wherein said first and second semiconductors are silicon and germanium respectively, the germanium being located at the downstream end of each zone.

4. A charge-coupled device according to claim 2, wherein said first and second semiconductors are silicon and a composite semiconductor respectively.

5. A charge-coupled device according to claim 1, wherein said first and second semiconductors are silicon and germanium respectively, the germanium being located at the downstream end of each zone.

6. A charge-coupled device according to claim 1, wherein said first and second semiconductors are silicon and a composite semiconductor respectively.

7. A charge-coupled device having one control line and comprising a substrate constituted by a first doped semiconductor, an array of metallic electrodes disposed in succession along an axis and separated by an interelectrode gap and isolated from said substrate by means of at least one thin insulating layer, means for creating beneath the electrodes a potential well having an asymmetrical depth for the minority carriers of said substrate, said well having a downstream end where the depth is the greatest and an upstream depth where the depth is the least to provide unidirectionality of transfer of said carriers from upstream end to downstream end along said axis beneath the electrodes, means for injecting minority carriers beneath at least the first electrode which defines the upstream end of said device, means for detecting the presence of charges beneath the last electrode which defines the downstream end of said device, means for creating an asymmetrical and permanent potential well for said minority carriers at the surface of the substrate and beneath said interelectrode gap, said well having a downstream end where the depth is the greatest and an upstream end where the depth is the least, said means being constituted by a region localized within said substrate and formed by a second semiconductor having a forbidden band width which is different from that of the first semiconductor, one of the two semiconductors which has the smallest forbidden band width being located at said downstream end of said well and a voltage supply connected by said control line to said electrodes which varies cyclically between two suitable values.

8. A charge-coupled device according to claim 7, wherein said first and second semiconductors are silicon and germanium respectively, the germanium being located at the downstream end of each zone.

9. A charge-coupled device according to claim 7, wherein said first and second semiconductors are silicon and a composite semiconductor respectively.

10. A charge-coupled device having one control line and comprising a substrate constituted by a first doped semiconductor, an array of metallic electrodes disposed in succession along an axis and separated by an interelectrode gap and isolated from said substrate by means of a thin insulating layer, means for creating a potential well with asymmetrical depth beneath the electrodes for the minority charge carriers of said substrate, said well having a downstream end where the depth is the greatest and an upstream end where the depth is the least to provide unidirectionality of the transfer of said carriers along said axis, means for injecting minority carriers beneath at least the first electrode which defines the upstream end for the device, means for creating an asymmetrical and permanent potential well for said minority carriers at the surface of the substrate and beneath said interelectrode gap, said well being of greater depth near said downstream end of said device than near the upstream end of said device with respect to the direction of transfer of said carriers, a voltage supply which varies cyclically between two suitable values and connected to said electrodes by said control line, wherein said means for creating beneath the electrodes an asymmetrical potential well for the minority charge carriers of said substrate are constituted by a region localized within said substrate and formed by a second semiconductor having a forbidden band width which is different from that of said first semiconductor, one of the two semiconductors which has the smaller forbidden band width being located at said downstream end of said well.

11. A charge-coupled device according to claim 10, wherein said first and second semiconductors are silicon and germanium respectively, the germanium being located at the downstream end of each zone.

12. A charge-coupled device according to claim 10, wherein said first and second semiconductors are silicon and a composite semiconductor respectively.

* * * * *